United States Patent [19]

Juskey et al.

[11] Patent Number: 5,323,947
[45] Date of Patent: Jun. 28, 1994

[54] METHOD AND APPARATUS FOR USE IN FORMING PRE-POSITIONED SOLDER BUMPS ON A PAD ARRANGEMENT

[75] Inventors: Frank Juskey, Coral Springs; Kenneth M. Wasko; Douglas W. Hendricks, both of Boca Raton, all of Fla.

[73] Assignee: Motorola, Inc., Schaumburg, Ill.

[21] Appl. No.: 55,589

[22] Filed: May 3, 1993

[51] Int. Cl.⁵ ............................................. B23K 3/08
[52] U.S. Cl. .................................. 228/56.3; 427/96; 156/297; 228/180.22
[58] Field of Search .................. 228/56.3, 180.22, 246, 228/255; 118/50; 156/297; 427/96

[56] References Cited

U.S. PATENT DOCUMENTS

| | | | |
|---|---|---|---|
| 3,396,894 | 8/1968 | Ellis | 228/56.3 |
| 4,462,534 | 7/1984 | Bitaillou et al. | 228/246 |
| 4,680,199 | 7/1987 | Vontell et al. | 118/50 |
| 4,720,324 | 1/1988 | Hayward . | |
| 4,832,255 | 5/1989 | Bickford et al. | 228/254 |
| 4,897,918 | 2/1990 | Osaka et al. | 29/830 |
| 5,088,639 | 2/1992 | Gondotra et al. | 228/246 |
| 5,118,027 | 6/1992 | Braun et al. | 228/180.22 |
| 5,205,896 | 4/1993 | Brown et al. | 228/56.3 X |

OTHER PUBLICATIONS

A. Aintila & Jarvinen, "Packaging of Dot-matrix Electroluminescent Display Module," Journal of the International Society for Hybrid Microelectronics-Europe, pp. 15-16, Jan. 1985, Scotland.

Karel Kopejko & Jindirch Vilim, "An Alternative Way of Making Bumps for Tape Automated Bonding," Electrocomponent Science & Technology, pp. 185-187, 1980, Great Britain.

A. P. Ingrahan, J. M. McCreary, & J. A. Varcoe, "Flip-Chip Soldering to Bare Copper Circuits," Proceedings of the IEEE, pp. 333-337, 1990, USA.

Gerald L. Ginsberg, "Chip-On-Board Profits from TAB & Flip-Chip Technology," Electronic Packaging & Production, pp. 140-143, Sep. 1985, USA.

IBM Tech Disclosure Bulletin, vol. 30, No. 4, Sep. 1987 p. 1755.

Primary Examiner—Kenneth J. Ramsey
Attorney, Agent, or Firm—R. Louis Breeden; Thomas G. Berry

[57] ABSTRACT

A method and apparatus for use in forming pre-positioned solder bumps (104) on a pad arrangement (100) of a substrate (101) include placing a predetermined pattern (306) of solder preforms (304) in contact with a meltable adhesive fluxing agent (302) on a carrier tape (402), and then heating the fluxing agent (302) to melt it. Next, the fluxing agent (302) is cooled to resolidify it, thereby securing the solder preforms (304) to the carrier tape (402). The carrier tape (402) is then aligned over the pad arrangement (100) and the solder preforms (304) are transferred to the pad arrangement (100) by heating the solder preforms (304) to form the solder bumps (104) in the predetermined pattern (306).

19 Claims, 3 Drawing Sheets

METHOD AND APPARATUS FOR USE IN FORMING PRE-POSITIONED SOLDER BUMPS ON A PAD ARRANGEMENT

FIELD OF THE INVENTION

This invention relates in general to direct chip attachment of integrated circuit chips to a substrate mounting pad arrangement, and more specifically to a method and apparatus for forming pre-positioned solder bumps on a substrate mounting pad arrangement for direct chip attachment applications.

BACKGROUND OF THE INVENTION

Direct chip attachment (DCA), also known as "flip chip" technology, is well known to those skilled in the art of integrated circuit mounting techniques. In DCA, the integrated circuit chip has a plurality of terminations on its active surface that are interconnected to a corresponding mounting pad arrangement on a substrate. The interconnections typically are made by raised areas of solder, or solder "bumps," between the substrate and the chip that are remelted during a reflow soldering process, or by heating with a laser. Because of the extremely tight spacing of the interconnections, e.g., 0.5 mm, placing the solder bumps requires great precision to avoid shorts and other defects.

One method that has been used to form the raised areas of solder is to electroplate a layer of tin/lead onto a pad arrangement through a laminated dry film plating resist—a time consuming process. Another method screens and reflows a solder paste onto the pad arrangement, unfortunately producing a high defect rate and resultant low yield. Yet another method forms the solder bumps on the chip itself, but this method typically is done by the chip manufacturer and is not practical or available for any but the most expensive of chips. The overall result of these conventional methods of solder bumping is a substantially increased board or chip cost.

Thus, what is needed is a method and apparatus for providing solder bumps for use in DCA technology. The method and apparatus should be inexpensive and fast, and should produce a high quality interconnection. Ideally, the method and apparatus should be compatible with field repair applications as well as factory production applications.

SUMMARY OF THE INVENTION

One aspect of the present invention is a method of attaching a predetermined pattern of solder preforms onto a carrier tape for use in forming pre-positioned solder bumps on a pad arrangement of a substrate. The method comprises the steps of placing the predetermined pattern of solder preforms into contact with a meltable adhesive fluxing agent on the carrier tape, and heating the fluxing agent to melt the fluxing agent while the predetermined pattern of solder preforms is in contact with the fluxing agent. The method thereafter further comprises cooling the fluxing agent to solidify the fluxing agent, thereby securing the predetermined pattern of solder preforms to the carrier tape.

Another aspect of the present invention is a method of forming pre-positioned solder bumps on a pad arrangement of a substrate. The method comprises the steps of positioning a predetermined pattern of solder preforms attached to a carrier tape by a meltable adhesive fluxing agent into aligned contact with the pad arrangement on the substrate, and thereafter transferring the predetermined pattern of solder preforms to the pad arrangement by heating the predetermined pattern of solder preforms.

Another aspect of the present invention is a processed tape for use in forming pre-positioned solder bumps on a pad arrangement of a substrate. The processed tape comprises a carrier tape, and a meltable adhesive fluxing agent coated onto the carrier tape for attaching a predetermined pattern of solder preforms thereto. The processed tape further comprises the predetermined pattern of solder preforms secured to the meltable adhesive fluxing agent through a process of heating and subsequently cooling the fluxing agent while the fluxing agent is positioned in contact with the predetermined pattern of solder preforms.

DESCRIPTION OF THE PREFERRED EMBODIMENT

Figure 1:
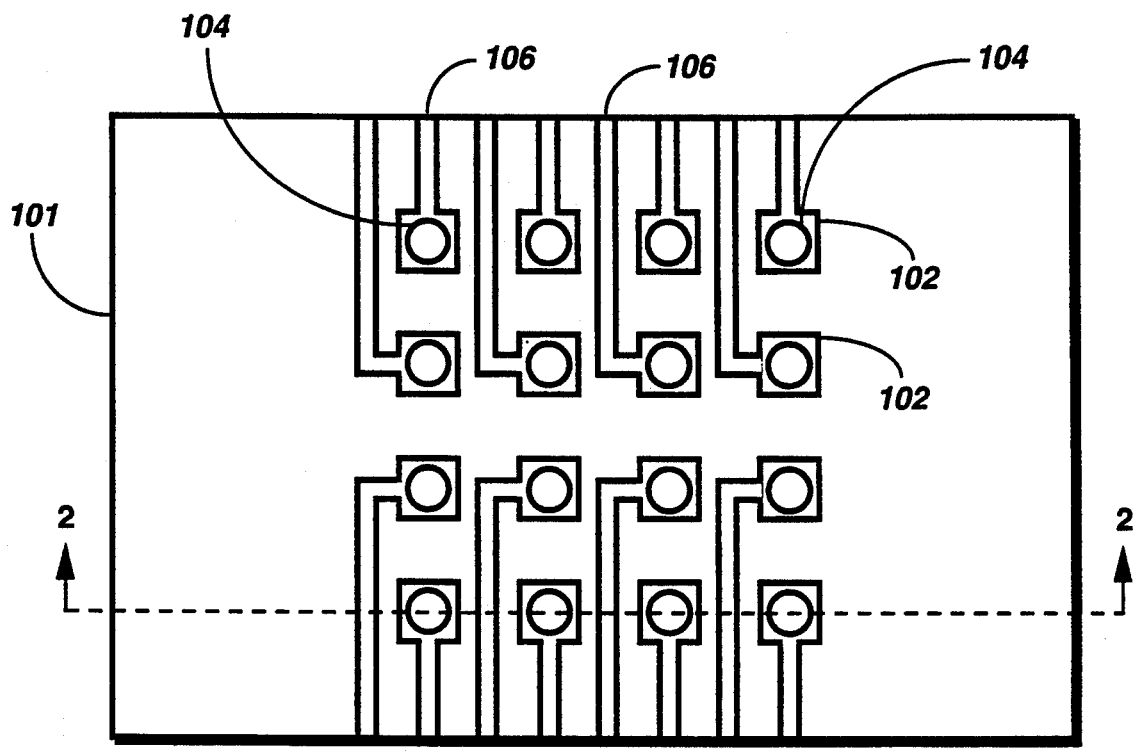
FIG. 1 is a top orthographic view of a pad arrangement in accordance with the preferred embodiment of the present invention.
Figure 2:
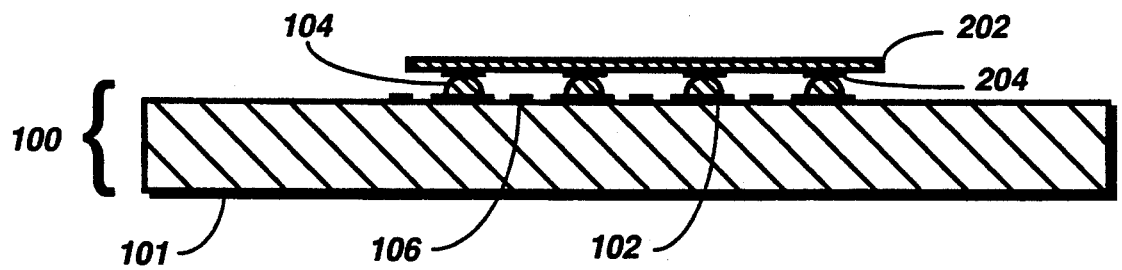
FIG. 2 is a cross-section view along the line 2—2 of FIG. 1 of the pad arrangement along with a direct chip attach component in accordance with the preferred embodiment of the present invention.

Referring to FIG. 1, a top orthographic view of a pad arrangement 100 in accordance with the preferred embodiment of the present invention comprises a substrate 101, mounting pads 102, and interconnects 106 for mounting and interconnecting a direct chip attach (DCA) component 202 (FIG. 2). While the pad arrangement 100 is depicted as a four-by-four pad array, it will be appreciated that other pad patterns may be used as well for the pad arrangement 100, e.g., peripheral-only pads, dual-in-line pads, a circular pattern of pads, etc. The pad arrangement 100 further comprises solder bumps 104 reflowed to the mounting pads 102 during a first reflow process for use in attaching the DCA component to the substrate 101 in a second, subsequent reflow process. The substrate 101 is preferably a conventional printed wiring board material, such as an epoxy glass weave composite. It will be appreciated that other substrate materials can be utilized as well, such as ceramic, cyanate ester, or polyimide composites. The mounting pads 102 and the interconnects 106 are conventional copper laminated to the substrate 101 and etched to form the pad arrangement 100, after which the mounting pads 102 and the interconnects 106 are preferably plated with additional copper for connecting any through-holes in the substrate. The material of the solder bumps 104 is preferably about fifty-five to seventy-five percent tin, the balance of the material being lead. It will be appreciated that other similar materials, such as those including tin, silver, gold, palladium-silver, or platinum-silver, may be used as well for the mounting pads 102 and the interconnects 106.

Referring to FIG. 2, a cross-section view along the line 2—2 of FIG. 1 depicts the pad arrangement 100 along with a conventional DCA component 202 in accordance with the preferred embodiment of the present invention. The cross-section view shows that the solder bumps 104 electrically and mechanically couple contact pads 204 of the DCA component 202 with the corresponding mounting pads 102 of the pad arrangement 100. An example of a conventional DCA component is the MC68HC05L8B microcontroller manufactured by Motorola, Inc. of Schaumburg, Ill.

Figure 3:
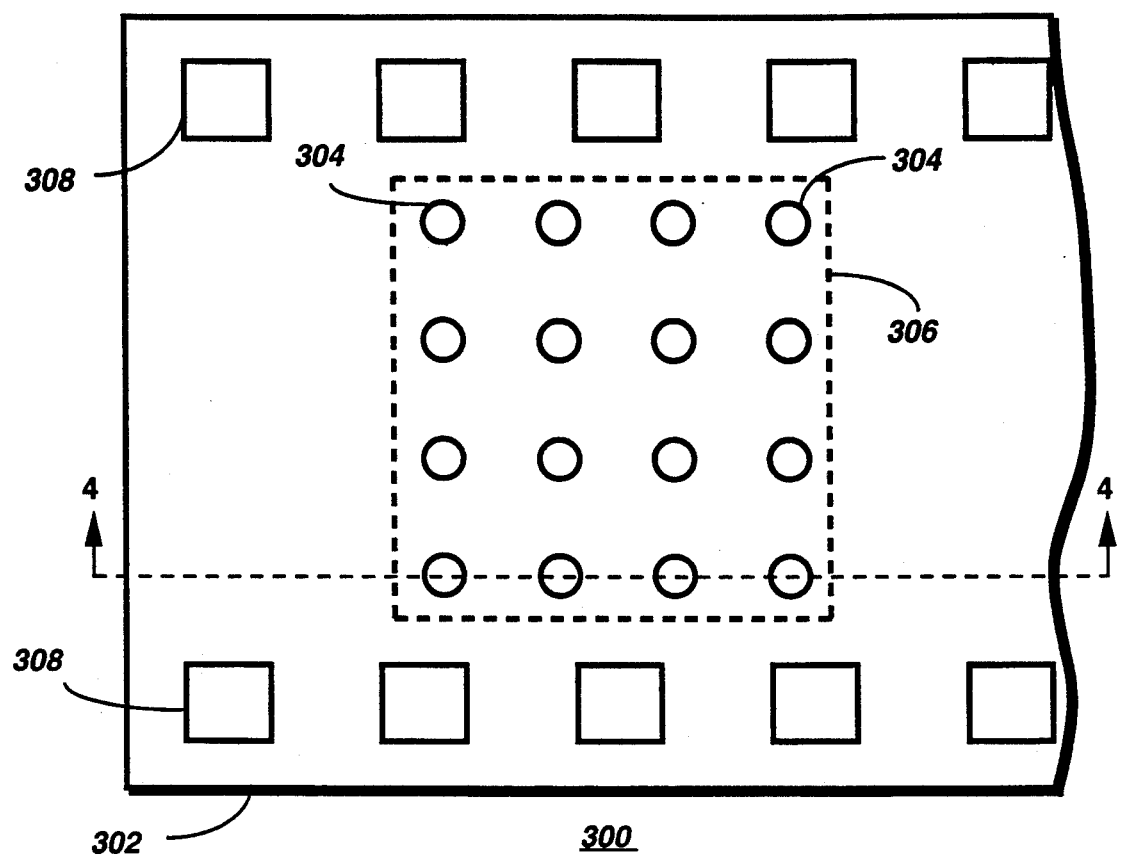
FIG. 3 is a top orthographic view of a portion of a processed tape having a predetermined pattern of solder preforms in accordance with the preferred embodiment of the present invention.
Figure 4:
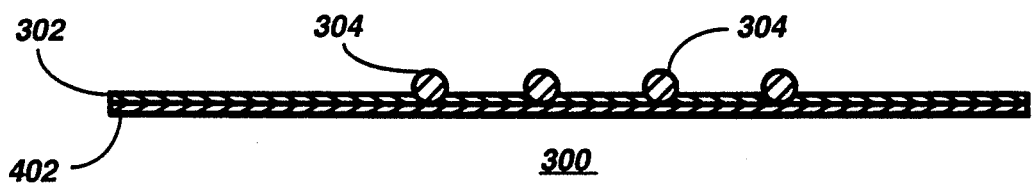
FIG. 4 is a cross-section view along the line 4—4 of FIG. 3 of the portion of the processed tape in accordance with the preferred embodiment of the present invention.

With reference to FIGS. 3 and 4, a top orthographic view and a side cross-section view along the line 4—4 depict a portion of a processed tape 300 having a predetermined pattern 306 of solder preforms 304 in accordance with the preferred embodiment of the present invention. The geometry of the predetermined pattern 306 is determined in accordance with the geometry of the pad arrangement 100 for which the processed tape 300 will be used to form the solder bumps 104, as described herein below. Each of the solder preforms 304 preferably is formed in a substantially spherical shape having a diameter of about 0.125 mm. Other diameters can be used as well, consistent with the dimensions and geometry of the pad arrangement 100.

The solder preforms 304 are attached to a carrier tape 402 by a layer of solder-compatible, adhesive fluxing material 302, which has been melted and then resolidified to secure the solder preforms 304 to the carrier tape 402 in the predetermined pattern 306. Sprocket holes 308 preferably are punched in the carrier tape 402 and fluxing material 302 for use in transporting and aligning the carrier tape with a tooling fixture for applying the solder preforms 304 in the predetermined pattern 306. The sprocket holes are further used in transporting and aligning the processed tape with the pad arrangement 100 (FIG. 1) during installation of the predetermined pattern 306 of the solder preforms 304 to form the solder bumps 104. It will be appreciated that other transport and alignment means, e.g., friction roller transport and optical alignment marks, can be used as well for aligning the carrier tape 402.

The carrier tape 402 is preferably a polyimide material, 0.05 mm thick, although other similar materials, such as polyetherimide, and other thicknesses, ranging from about 0.025 to 0.125 mm, can be used as well. The solder-compatible, adhesive fluxing material 302 is preferably a 0.05 mm thick coating of rosin-based abiatic acid. It will be appreciated that adipic and other similar medium molecular weight organic poly acid compounds can be used as well for the solder-compatible, adhesive fluxing material 302, and that the thickness of the coating can vary, depending on the size of the solder preforms 304 and the dimensions of the pad arrangement 100. The preferred materials are advantageously inexpensive and easily lend themselves to economical mass production techniques for fabricating printed wiring boards for DCA components, as will be described below.

Figure 5:
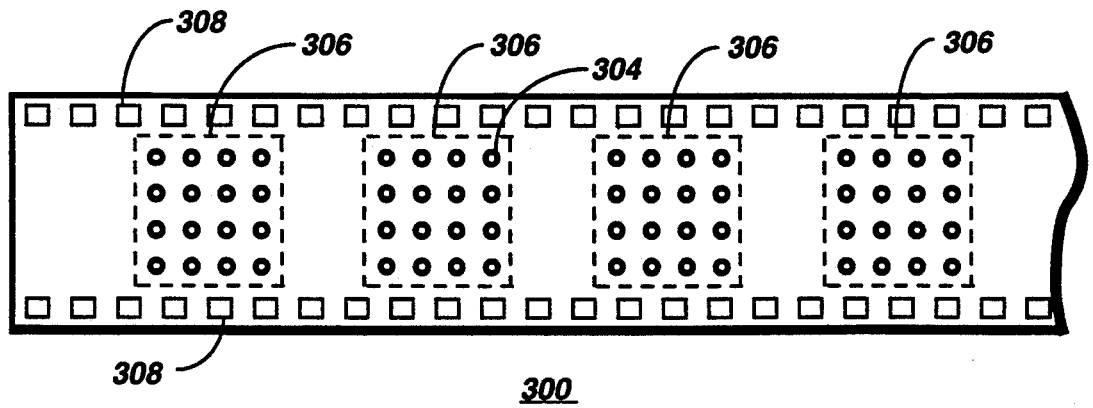
FIG. 5 is a top orthographic view of a longer portion of the processed tape depicting a plurality of the predetermined patterns of solder preforms in accordance with the preferred embodiment of the present invention.

Referring to FIG. 5, a top orthographic view of a longer portion of the processed tape 300 depicts a plurality of the predetermined patterns 306 of the solder preforms 304 positioned in accordance with the preferred embodiment of the present invention. The longer portion of the processed tape 300 shown in FIG. 5 illustrates by example that the processed tape 300 can contain multiple repetitions of the predetermined pattern 306 of the solder preforms 304 for use in a repetitive manufacturing process.

Figure 6:
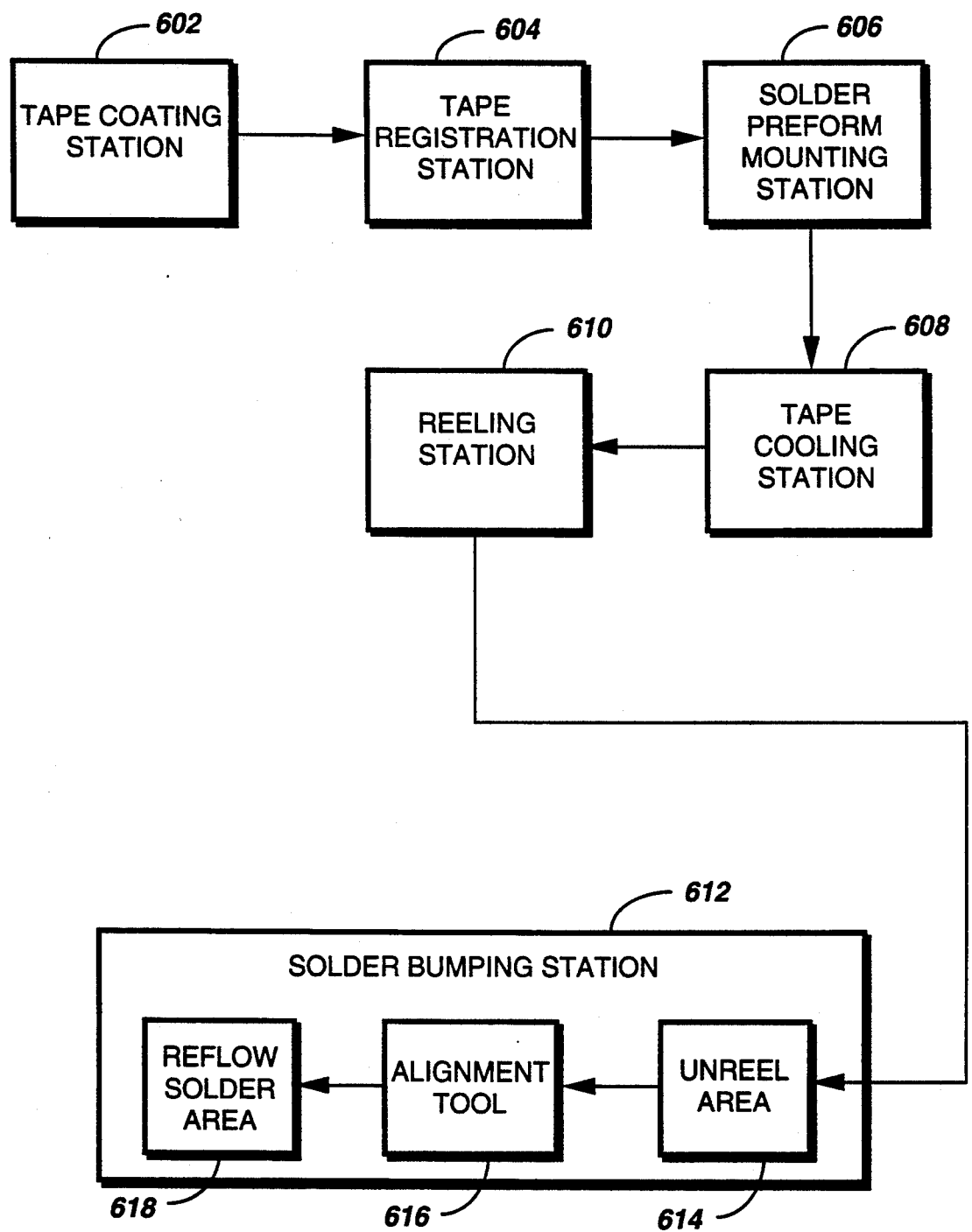
FIG. 6 is a block diagram of a process for making and using the processed tape in accordance with the preferred embodiment of the present invention.

Referring to FIG. 6, a block diagram of a process for making and using the processed tape in accordance with the preferred embodiment of the present invention comprises a tape coating station 602 for coating the solder-compatible, adhesive fluxing material 302 onto the carrier tape 402. The coating is performed by heating the solder-compatible, adhesive fluxing material 302 above its melting point, and then applying the melted fluxing material 302 to the carrier tape 402, preferably in a curtain coating process. Alternatively, roller coating and screening processes can be used as well for applying the melted fluxing material 302. The carrier tape 402 then moves to a tape registration station 604, where sprocket holes are punched in the coated carrier tape 402 for use in transporting and aligning the carrier tape 402 with production tooling fixtures. Next, the coated carrier tape 402 moves to a solder preform mounting station 606, where the coated carrier tape 402 is positioned into alignment with a tooling fixture loaded with the solder preforms 304 arranged in the predetermined pattern 306. The tooling fixture holds the solder preforms 304 securely in position, e.g., by a vacuum, and then brings the solder preforms 304 into contact with the coating of solder-compatible, adhesive fluxing material 302 on the carrier tape 402. While the solder preforms 304 are in contact with the fluxing material 302, the fluxing material 302 is melted, preferably by bringing a heated bar into contact with the carrier tape 402. Then the solder preforms 304 are released from the tooling fixture, e.g., by removing the vacuum, so that the solder preforms 304 will adhere to the melted fluxing material 302 when the tooling fixture is retracted.

Next, the carrier tape 402 and the adhering predetermined pattern 306 of the solder preforms 304 move to the tape cooling station 608, where the fluxing material 302 is cooled to resolidify it to secure the solder preforms 304 to produce the processed tape 300. The cooling is performed, for example, by bringing a heat sinking bar into contact with the carrier tape 402. Finally, the processed tape 300 moves to a reeling station 610 for winding the processed tape 300 onto reels until needed.

When needed for forming the solder bumps 104 on the pad arrangement 100, a reel of the processed tape 300 is moved to a solder bumping station 612 and loaded onto an unreeling area 614. From there the processed tape 300 is fed into an alignment tool 616 for individually punching a predetermined pattern 306 of the solder preforms 304 from the processed tape 300 and then aligning the individual predetermined pattern 306 of the solder preforms 304 with a corresponding pad arrangement 100 to be solder bumped. After alignment, the predetermined pattern 306 of the solder preforms 304 is brought into contact with the pad arrangement 100 and then heated by a reflow solder process in a reflow solder area 618 to form the solder bumps 104 on the corresponding mounting pads 102. The solder bumps 104 will subsequently be reheated in an additional reflow soldering process to attach the DCA component 202.

It will be appreciated that slight variations in the order of and methods used in the operations of the process described herein above can be made by one of ordinary skill in the art without materially changing the process in accordance with the present invention.

Thus, the present invention provides a method and apparatus for attaching a predetermined pattern of solder preforms onto a carrier tape for use in forming pre-positioned solder bumps on a pad arrangement of a substrate for use in DCA component mounting. The present invention advantageously eliminates the need for costly and time-consuming pad arrangement solder plating operations, while providing an inexpensive and fast DCA mounting of high quality. In addition, the present invention is compatible with field repair applications as well as factory production applications, because the processed tape can be transported and used anywhere.

What is claimed is:

1. A method of attaching a predetermined pattern of solder preforms onto a carrier tape for use in forming pre-positioned solder bumps on a pad arrangement of a substrate, the method comprising the steps of:
   placing the predetermined pattern of solder preforms into contact with a meltable adhesive fluxing agent on the carrier tape;
   heating the fluxing agent to melt the fluxing agent while the predetermined pattern of solder preforms is in contact with the fluxing agent; and
   thereafter cooling the fluxing agent to solidify the fluxing agent, thereby securing the predetermined pattern of solder preforms to the carrier tape.

2. The method of claim 1, further comprising the step of repeating the placing, heating, and cooling steps to attach a plurality of the predetermined patterns of solder preforms onto the carrier tape.

3. The method of claim 1, further comprising the step of adding registration means to the carrier tape prior to said placing step for registering the carrier tape to a tooling fixture.

4. The method of claim 1, further comprising the step of coating the carrier tape with the meltable adhesive fluxing agent prior to said placing step.

5. The method of claim 1, wherein the placing step comprises the step of loading a tooling fixture with the solder preforms to pre-position the solder preforms into the predetermined pattern.

6. The method of claim 1 wherein the carrier tape is formed of a material selected from the group of materials consisting of polyimide and polyetherimide.

7. The method of claim 1 wherein the meltable adhesive fluxing agent is a medium molecular weight organic poly acid compound.

8. The method of claim 1, wherein the placing step further comprises the step of positioning the carrier tape into contact with the predetermined pattern of solder preforms in a tooling fixture such that registration means of the carrier tape registers with aligning means of the tooling fixture.

9. The method of claim 8, wherein the heating step comprises the step of releasing the solder preforms from the tooling fixture, thereby allowing the predetermined pattern of solder preforms to adhere to the melted fluxing agent.

10. A method of forming pre-positioned solder bumps on a pad arrangement of a substrate, the method comprising the steps of:
    positioning a predetermined pattern of solder preforms attached to a carrier tape by a meltable adhesive fluxing agent into aligned contact with the pad arrangement on the substrate; and
    transferring thereafter the predetermined pattern of solder preforms to the pad arrangement by heating the predetermined pattern of solder preforms.

11. The method of claim 10, wherein the transferring step comprises the step of heating the predetermined pattern of solder preforms by a reflow soldering process.

12. The method of claim 10, wherein the positioning step comprises the step of loading a tooling fixture with the carrier tape.

13. The method of claim 10, wherein the positioning step further comprises the step of aligning the carrier tape with the pad arrangement.

14. The method of claim 13, wherein the positioning step further comprises the step of placing the predetermined pattern of solder preforms attached to the aligned carrier tape into contact with the pad arrangement.

15. A processed tape for use in forming pre-positioned solder bumps on a pad arrangement of a substrate, the processed tape comprising:
    a carrier tape;
    a meltable adhesive fluxing agent coated onto the carrier tape for attaching a predetermined pattern of solder preforms thereto; and
    the predetermined pattern of solder preforms secured to the meltable adhesive fluxing agent through a process of heating and subsequently cooling the fluxing agent while the fluxing agent is positioned in contact with the predetermined pattern of solder preforms.

16. The processed tape of claim 15, further comprising a plurality of the predetermined patterns of solder preforms secured to the carrier tape.

17. The processed tape of claim 15, further comprising registration means for registering the carrier tape to a tooling fixture.

18. The processed tape of claim 15, wherein the carrier tape is formed of a material selected from the group of materials consisting of polyimide and polyetherimide.

19. The processed tape of claim 15, wherein the meltable adhesive fluxing agent is a medium molecular weight organic poly acid compound.

* * * * *